June 27, 1961 A. D. SCARBROUGH 2,990,478

ANTI-SATURATION CIRCUITS FOR TRANSISTOR AMPLIFIERS

Filed Feb. 25, 1957 2 Sheets-Sheet 1

INVENTOR.
ALFRED DALE SCARBROUGH
BY ELWOOD S. KENDRICK
& Lester S. Hecht
ATTORNEYS INVENTOR.
ALFRED DALE SCARBROUGH
BY ELWOOD S. KENDRICK
& Lester S. Hecht
ATTORNEYS United States Patent Office 2,990,478

Patented June 27, 1961

2,990,478

ANTI-SATURATION CIRCUITS FOR TRANSISTOR AMPLIFIERS

Alfred Dale Scarbrough, Los Angeles, Calif., assignor, by mesne assignments, to Thompson Ramo Wooldridge Inc., Cleveland, Ohio, a corporation of Ohio Filed Feb. 25, 1957, Ser. No. 642,070
4 Claims. (Cl. 307—88.5)

Figures 1, 1A:
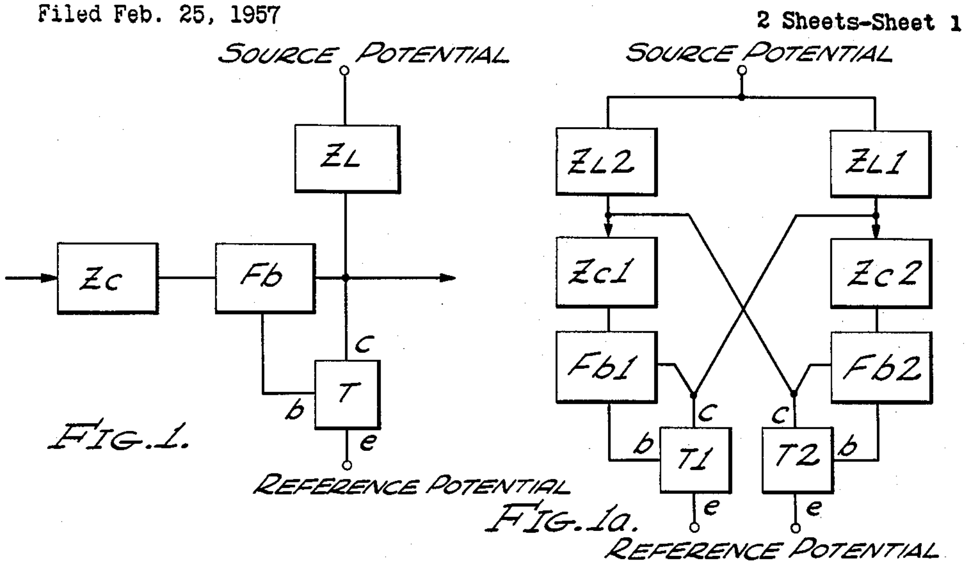

This invention relates to anti-saturation circuits for transistor amplifiers and, more particularly, to a feedback arrangement for a junction transistor amplifier circuit which may form part of a transistor multivibrator, the feedback arrangement being designed to limit the maximum current level of the transistor amplifier so as to prevent saturation and thereby avoid operating the transistor in a region of poor pulse response.

It is now well known that the junction transistor is particularly useful for low impedance switching applications, but that such a trasistor has the undesirable characteristic of lagging in pulse response if driven into saturation. As a result many attempts have been made in the prior art to limit the amplification region of the junction transistor so that it may be operated at a higher pulse rate without affecting its switching function. The general problems in this field, as well as a particular approach to the problem, are discussed in an article entitled "Non-Saturating Pulse Circuits Utilizing Two Junction Transistors" found on pages 826 through 834 of the Proceedings of the I.R.E., July 1955.

As is pointed out in this article, analysis indicates, and experiment verifies, that a pulse circuit utilizing junction transistors currently available can switch an input signal in and out in a fraction of microsecond provided that the transistors involved are not driven into saturation as the collector voltage falls to zero. If the transistor is driven into saturation, recovery from this condition may be so time consuming that the entire switching operation may be delayed by a considerable amount.

After recognizing the basic problem, the abovementioned article then proceeds to provide a solution applicable to cross-coupled junction transistors in a multivibrator. In accordance with the technique taught therein, two diodes referenced as D1 and D2 in FIG. 4 of the article are arranged so that at all times, one of the diodes is in a Zener breakdown condition where it is an effective voltage source. It is pointed out that these diodes coupled between the collector electrodes of the cross-coupled transistors maintain a constant voltage, referenced as $V_{bs}$, therebetween.

The voltage $V_{bs}$ of the article is then applied to the conducting transistor base electrode through another diode caused to be in its Zener breakdown condition, and providing a low impedance feedback path with a constant voltage for regulating the current of the transistor. Thus in FIG. 4 of the article, diodes D3 and D4 are employed for coupling the Zener potentials of diodes D1 and D2 to the base electrodes of transistors T2 and T1, respectively.

This prior art technique has several disadvantages. In the first place, the approach is only suitable for a multivibrator circuit since the transistors are not regulated independently. Diodes D1 and D2 are in the feedback path for both transistors and consequently current must be available to pass through either of the transistors through these diodes.

The circuit is also susceptible to being driven into saturation due to the power supply variation. Thus, with an increase of voltage applied to resistors R2, shown in FIG. 4, a parallel path for an increased amount of current for either conducting transistor is provided and consequently may have the effect of driving the conducting transistor into saturation. To illustrate this, suppose in particular that transistor T1 is conducting and transistor T2 is not. It should be evident then that the increase in voltage applied to resistors R2 will cause an increase in current passing through both of these resistors and through the collector to emitter path of transistor T1. This voltage variation may drive transistor T1 into saturation in spite of the feedback effect through diodes D1, D2, and D4 to the base electrode thereof.

A further limitation of this prior art approach is that the anti-saturation diodes D1 and D2 must be switched from a forward bias condition to a Zener breakdown condition rather than simply from a low impedance condition to a high impedance condition. This places a switching limitation upon the circuit which will be shown to be unnecessary in the practice of the present invention. Furthermore, the prior art technique requires that the collector-to-base potential across the conducting transistor be a function of the Zener breakdown potential of two diodes connected in series, such as diodes D1 and D4, and the forward impedance of a third diode, such as diode D2. This requirement makes it difficult to insure that the proper collector-to-base potential will appear across the transistors.

The present invention provides an improved technique for preventing saturation in a junction transistor amplifier that is applicable as well to a single switching amplifier as it is to a set of cross-coupled transistor amplifiers in a multivibrator circuit. In accordance with the basic concept of the present invention, a direct negative feedback circuit is provided coupling the base and collector electrodes of each transistor. This feedback circuit includes a low impedance source for establishing a predetermined potential across the collector-base path of the transistor, and means for applying this potential to the collector electrode of the transistor during such time as the transistor is in a high conducting state.

In its basic structural form the invention comprises a feedback circuit which is coupled between the collector electrode of the transistor and the base electrode thereof, the input signal for the transistor being applied through an input, or coupling impedance, to the feedback circuit. The junction of the transistor collector electrode and the feedback circuit is then coupled to the load impedance for the amplifier.

In its general form the feedback circuit includes a low impedance source of potential having one terminal coupled to the base electrode of the transistor and the other terminal coupled through a unilateral device, such as a diode, to the collector electrode of the transistor. The junction between the source and the diode, then, is coupled to the input impedance which may also correspond to the coupling impedance of a multivibrator circuit. The junction of the diode and the collector electrode of the transistor is coupled to the load impedance of the amplifier.

In one specific form of the invention, the low impedance source of potential may be a battery having one terminal connected to the base of the transistor and the other terminal coupled to the collector electrode of the transistor through a diode arranged with its electrode in the same bias direction as the transistor. Thus, if an NPN transistor is employed the diode has its cathode coupled to the collector electrode of the transistor and its anode coupled to the positive terminal of the battery so that regulating feedback current passes through the low impedance of the diode when forward biased and the low impedance collector-emitter path of the transistor. Whereas, where PNP transistors are employed, the diode has its anode coupled to the collector electrode of the transistor and its cathode is connected to the negative terminal of the battery, the positive terminal thereof being coupled to the base electrode of the transistor.

In other embodiments of the invention, the battery or low impedance source may be replaced with a Zener diode, which provides an effective source when in its breakdown condition. The employment of the Zener diode in accordance with the present invention may be contrasted to its utilization according to the prior art discussed above, where the same diode must also function in its forward bias direction. According to the present disclosure, the Zener diode is either operated in its breakdown condition or in its back-bias condition, where effectively an open circuit exists. Thus, the switching limitation present in the prior art technique is avoided by the present invention since the Zener diode need only be conducting on one voltage bias region. Furthermore, the feedback circuit of the invention operates independently for each transistor and consequently allows a more accurate establishment of the desired collector-base potential preventing saturation. In addition, the independent action of the feedback circuits of the invention minimizes the problem of saturation due to power supply variation as in the prior art.

When the Zener diode replaces the battery in the NPN transistor configuration of the invention, its anode is connected to the base electrode of the transistor and its cathode is coupled through a non-Zener diode to the collector electrode of the transistor. The non-Zener diode is connected in the same bias direction as the collector-emitter path of the transistor, having its cathode connected to the collector of the transistor and its anode connected to the Zener diode. On the other hand, when the Zener diode replaces a battery connected in the opposite manner, where a PNP transistor is employed, its cathode is coupled to the base electrode of the transistor and its anode is coupled through a non-Zener diode to the collector electrode of the transistor. The non-Zener diode then has its anode connected to the collector of the transistor and its cathode connected to the Zener diode.

The basic non-saturating amplifier configuration of the invention just described may readily be incorporated into a multivibrator circuit where each input impedance corresponds to a cross-coupling impedance in the multivibrator circuit. In the multivibrator circuit as well as perhaps in the utilization of the invention in a pulse or switching amplifier, it may be desirable to bypass the Zener diode employed as a low impedance source with a capacitor in order to enhance the trigger speed of the arrangement. This is desirable because a finite time is required to break down the Zener diode, and during this time the initial feedback current to prevent saturation passes through the bypass capacitor. If it is assumed, however, that an ideal low impedance source is available, the bypass capacitor is not required.

Accordingly, it is an object of the present invention to provide an improved anti-saturation circuit for a transistor amplifier.

Another object of the invention is to provide an anti-saturation circuit for a transistor amplifier which is substantially insensitive to voltage variations of the source driving the load impedance of the amplifier.

It is a further object of the invention to provide a feedback circuit for preventing saturation in a transistor amplifier circuit while accurately setting the collector-to-base potential thereof at a desired pre-saturation level.

A more specific object of the present invention is to provide a device for preventing saturation in a transistor multivibrator through the employment of separate feedback circuits coupling the collector and base electrodes of each of the transistors and thereby obviating the undesirable cross-coupling effects of anti-saturation circuits previously known.

The novel features which are believed to be characteristic of this invention, both as to its organization and method of operation, together with further objects and advantages thereof, will be better understood from the following description considered in connection with the accompanying drawings, in which several embodiments of the invention are illustrated by way of example. It is to be expressly understood, however, that the drawings are for the purpose of illustration and description only, and are not intended as a definition of the limits of the invention.

Figures 2, 3:
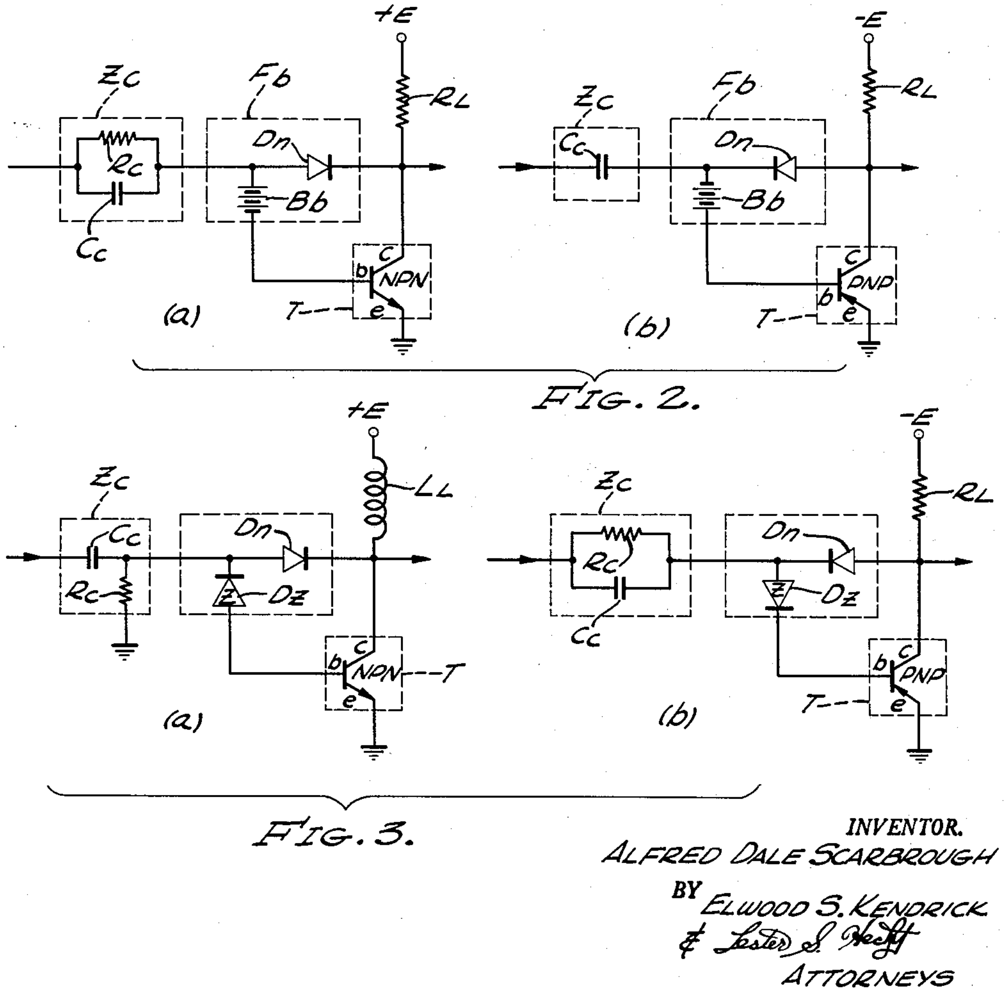
Figure 4:
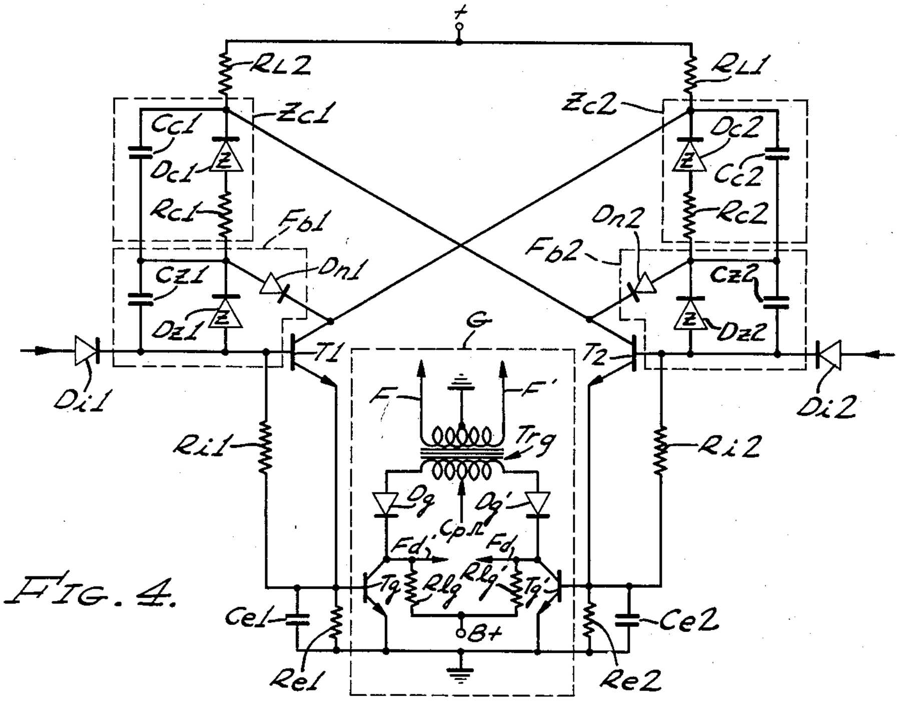
Figure 5:
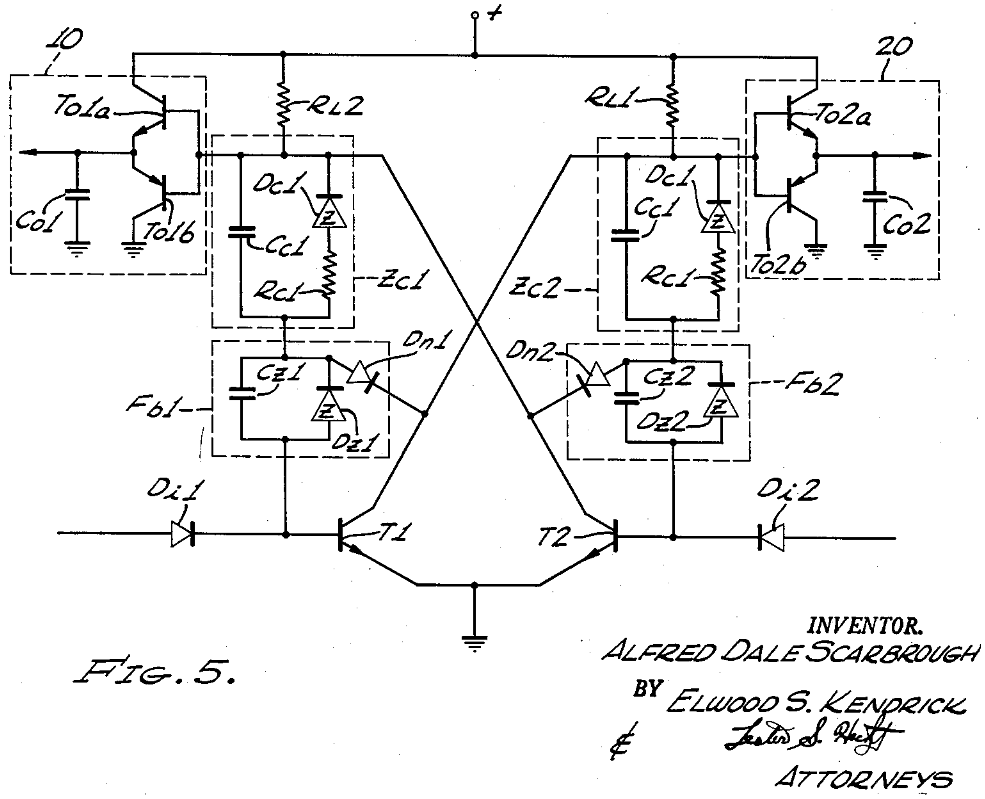

FIG. 1 is a block diagram of the general form of a transistor amplifier circuit employing the invention;

FIG. 1*a* is a block diagram of the general form of a transistor multivibrator circuit employing the invention;

FIG. 2 illustrates two forms of transistor amplifiers employing the invention where FIG. 2*a* illustrates the utilization of the invention with NPN transistors and where FIG. 2*b* illustrates the utilization of PNP transistors;

FIGS. 3*a* and 3*b* illustrate the employment of Zener diodes as low impedance source means in accordance with the invention in NPN and PNP types of amplifiers, respectively;

FIG. 4 shows a schematic diagram of a suitable bistable device employing the present invention; and FIG. 5 illustrates another form of bistable device employing an arrangement of the invention.

Reference is now made to FIG. 1 where the general form of an amplifier employing the present invention is shown. As indicated in FIG. 1 a transistor T has its base electrode (*b*) coupled through a feedback circuit F*b* to its collector electrode (*c*). The feedback circuit receives an input signal through an input or coupling impedance Z*c* and the collector electrode of the transistor is coupled to the suitable source potential through a load impedance ZL. The emitter electrode of the transistor receives a suitable reference potential.

In its general operation, feedback circuit F*b* is arranged to establish a predetermined voltage between the collector and base electrodes of transistor T and further to change the base potential of transistor T in a manner offsetting any tendency of this transistor to be driven into its saturation region. The predetermined voltage is selected to be greater than the collector-base saturation voltage for the transistor T.

The utilization of the invention in a multivibrator circuit is shown generally in FIG. 1*a*. As indicated in FIG. 1*a*, two load impedances ZL1 and ZL2 are shown corresponding to ZL of FIG. 1; two coupling impedances Z*c*1 and Z*c*2 are shown corresponding to Z*c* of FIG. 1; two feedback circuits F*b*1 and F*b*2 are shown corresponding to F*b* of FIG. 1; and two transistors T1 and T2 are shown corresponding to transistors T of FIG. 1. Thus, two basic amplifiers with means for preventing saturation are effectively shown in FIG. 1*a*, cross-coupled in an appropriate manner to form a multivibrator. In particular, one such circuit is found starting with the input signal applied to the coupling impedance Z*c*1 which is coupled to feedback circuit F*b*1 providing the desired regulating voltage and low impedance feedback path for transistor T1, which has a load ZL1.

The basic concept of the invention will be better understood when a few of the particular arrangements incorporating the invention have been described. Reference, therefore, for this purpose is first made to FIG. 2*a*. As indicated in FIG. 2*a*, feedback circuit F*b* may include a battery source B*b*, and a diode D*n* for coupling the positive terminal of source B*b* to the collector of an NPN transistor T. As a convenient representation, it is assumed that the reference potential applied to the emitter of transistor T is ground. Diode D*n* is connected with its cathode coupled to the collector electrode of transistor T and its anode coupled to the positive terminal of battery B*b*. The negative terminal of battery B*b* is then coupled to the base electrode of transistor T. The collector of transistor T is also coupled to a load resistor RL which receives a suitable positive potential +E, and input signals to the amplifier are applied through a coupling impedance Z*c* including a resistor R*c* and capacitor C*c*, coupled in parallel.

The potential of battery B*b* is selected to provide a forward bias for transistor T when it is in its conducting state which is greater than the saturation potential because transistor T is driven into saturation when the collector voltage drops to zero. As the collector current approaches saturation, the collector potential drops, and when the collector potential reaches the potential of battery B*b* diode D*n* conducts, thereby opening a low impedance feedback path from the collector to the base. Any tendency of transistor T to draw more current then results in the feeding back of a negative signal change through forward biased diode D*n* and low impedance battery B*b* to the base electrode of transistor T, which then limits the current therethrough. In this manner, a negative feedback stabilization loop is completed regulating the current through transistor T as a function of the battery potential B*b*. When an input signal is applied through input impedance Z*c* tending to decrease collector current, the bias potential at the anode of diode D*n* is lowered and diode D*n* is cut off, thereby opening the negative feedback loop and quickly restoring the transistor to its normal operating condition in the region below saturation.

An equivalent arrangement of the invention is found in FIG. 2*b* where a PNP transistor is employed. In this case, the battery B*b* has its positive terminal connected to the base electrode of the transistor, and its negative terminal is then coupled through diode D*n* to the collector electrode of the transistor. Again it will be noted that diode D*n* is connected in the forward bias direction of the transistor so that current flows in the same direction through the transistor T and diode D*n* during the forward bias condition of each.

As a variation, it will be noted that input or coupling impedance Z*c* is shown only as a capacitor corresponding to a pulse amplifier situation or, perhaps, to a basic amplifier circuit which may be employed in a free-running multivibrator.

The utilization of Zener diodes as a means for providing the low impedance source potential is shown in FIG. 3, which are functionally similar to the embodiments of FIG. 2, described above, except for the obvious variations in input and output circuits. Referring specifically to FIG. 3*a*, it will be noted that a pulse input circuit Z*c* shown is similar to that shown in FIG. 2*b*, but that an NPN transistor is employed. It will also be noted that, as another variation, load resistor RL is replaced with load inductor LL which may very well correspond to the primary inductance of a coupling transformer. A Zener diode D*z* is introduced into the circuit so that it is caused to assume a breakdown condition when the input signal applied to impedance Z*c* assumes a predetermined level. It will be understood by those skilled in the art that the predetermined level is chosen in accordance with the desired maximum collector current level. Diode D*z* then provides an effective source potential which is then applied through forward biased diode D*n* to the collector electrode of transistor T. If transistor T begins to draw saturation current which would draw the level of the collector electrode thereof below the Zener breakdown potential diode D*z*, a negative feedback action begins which reduces the potential of the base electrode of transistor T. Thus, the transistor is stabilized in a high-current conducting operation where the potential between collector and base electrodes is substantially equal to the breakdown potential of diode D*z*.

A similar arrangement employing a Zener diode with a PNP transistor is shown in FIG. 3*b* where the coupling impedance Z*c* of FIG. 2*a* is shown and a resistive load RL is introduced again. In the case of the PNP transistor, it will be noted that Zener diode has its electrodes reversed with respect to FIG. 3*a*, as is also the case for diode D*n*.

The manner in which the present invention may be employed in a specific bistable multivibrator circuit is illustrated in FIG. 4. In FIG. 4 the cross-coupling circuits Z*c*1 and Z*c*2 include Zener diodes D*c*1 and D*c*2, respectively, employed in the same manner as in copending U.S. patent application for "Multivibrator Circuits Employing Breakdown Devices" by Cravens L. Wanlass, Serial No. 513,426, filed June 6, 1955. In general, the Zener diodes provide a highly stable bistable element where only one of the Zener diodes is broken down at a time and maintains the corresponding associated transistor in a highly conducting state.

Feedback circuits F*b*1 and F*b*2 then are introduced in accordance with the present invention, the particular circuits corresponding to FIG. 3*a* discussed above with the addition of bypass capacitors C*z*1 and C*z*2.

In addition to the basic multivibrator circuit, FIG. 1 also shows a suitable form of output gating circuit G, as is more fully described in copending U.S. patent application for "Improvements in Gating Circuits for Electronic Computers" by Alfred Dale Scarbrough, filed November 1, 1956, Serial No. 619,699, now Patent No. 2,892,103, issued June 23, 1959. It will be noted that one of the features of gating circuit G is that it permits the derivation of signals from the multivibrator at the emitter electrodes of transistors T1 and T2 which are coupled, respectively, to the base electrodes of the gating transistors T*g* and T*g'*. Gating circuit G will be noted to include a transformer T*rg* having a primary winding with first and second ends coupled, respectively, to the collector electrodes of transistors T*g* and T*g'* through associated diodes D*g* and D*g'*. Clock pulses then are applied to the center tap of the primary winding of transformer T*rg* and, depending upon the state of the bistable multivibrator, pass through either transistor T*g* or T*g'*. In particular, when transistor T1 is conducting, gating transistor T*g* is forward biased and a clock pulse applied to the center tap of transformer T*rg* passes then through forward biased diode D*g* and transistor T*g*. This, then, provides a positive output pulse F and a negative output pulse F' derived from the secondary winding of transformer T*rg*.

Gating circuit G includes two resistors R*lg*, R*lg'* for applying B+ potential to the collector electrodes of transistors T*g* and T*g'*, respectively. This arrangement allows the derivation of D.-C. level signals representing the state of the multivibrator. The features of gating circuit G just described form no part of the present invention. It has, therefore, been described only to point out the manner in which the anti-saturation feature of the invention may be combined with it. Reference again is made to the above-mentioned copending Scarbrough application for further details respecting its theory of operation.

In order to give the complete picture of the bistable multivibrator circuit employing the invention, FIG. 4 also shows a typical arrangement of the input diodes D*i*1 and D*i*2 coupled, respectively, to the base electrodes of transistors T1 and T2. Also shown are input resistors R*i*1 and R*i*2 and emitter resistors R*e*1 and R*e*2 coupled to the base and emitter electrodes of transistors T1 and T2, respectively. Emitter resistors R*e*1 and R*e*2 are bypassed by suitable emitter capacitors C*e*1 and C*e*2, respectively.

The manner in which the present invention operates in the bistable multivibrator configuration of FIG. 4 may best be understood by considering a specific example. Assume, then, that a positive pulse is applied through diode D*i*1 to the base electrode of transistor T1. This, then, causes the transistor to draw more current through its load resistor RL1 reducing the potential across Zener diode D*c*2. As a result, Zener diode D*c*2 assumes a high impedance and tends to cut off the current passing through the base of transistor T2. As the conduction is reduced through transistor T2, the potential across Zener diodes D*c*1 and D*z*1 increases causing both of these diodes to break down and further increasing the current available to the base of transistor T1. It may also be noted that bypass capacitor C*z*1 passes current during the transition period, aiding in the triggering action.

But for the inclusion of the anti-saturation circuit of the present invention, the cross-coupling arrangement of the multivibrator would tend to drive the transistor T1 into saturation. However, it will be noted that as the potential at the collector electrode of transistor T1 drops, diode D*n*1 becomes forward biased as soon as the potential of the collector falls to the Zener breakdown potential of diode D*c*1. In this manner, then, a low impedance feedback path is provided through diode D*n*1 and Zener diode D*z*1 to the base electrode of transistor T1.

In analyzing FIG. 4 in particular detail, it will be noted that the reduction in voltage at the base of transistor T1 due to the feedback through diodes D*n*1 and D*z*1 is due, in part, to the increased current through cross-coupling impedance Z*c*1 and through input resistor R*i*1. In the previously shown embodiments of the invention, input resistor R*i*1 was not present since the voltage-dropping effect of cross-coupling impedance Z*c*1 may be sufficient. However, it has been found that it is desirable to avoid allowing the base electrodes of the transistors to float and, accordingly, input resistors R*i*1 and R*i*2 are preferably provided.

It will also be noted that capacitors C*z*1 and C*z*2 aid the pulse response of the feedback circuits F*b*1 and F*b*2 by providing a low impedance feedback path during the transition period prior to the time that Zener diodes D*z*1 and D*z*2 are broken down.

Another specific arrangement employing the present invention is shown in FIG. 5 and corresponds to a type of flip-flop which is described in detail in the above-mentioned copending application by Cravens L. Wanlass. This circuit is similar to that shown in FIG. 4 with the exception of output circuits 10 and 20, including output storage capacitors C*o*1 and C*o*2, respectively. Transistors T*o*1*a* and T*o*1*b* are included in output circuit 10 for charging and discharging capacitor C*o*1 and transistors T*o*2*a* and T*o*2*b* are included in output circuit 20 for charging and discharging storage capacitor C*o*2. These output circuits form no part of the present invention and are amply described in the above-mentioned copending application by Cravens L. Wanlass and will not be considered further here. Furthermore, it is believed that the operation of feedback circuits of the present invention should be evident from the previous example.

From the foregoing description, it should now be apparent that the present invention provides an improved anti-saturation circuit for transistor amplifiers. The invention has been described in several different arrangements, although it will be understood that the examples herein are by no means exhaustive of all the possibilities. It has been shown that the anti-saturtion circuit of the invention may be employed either with individual junction transistor type of amplifiers, or with two such amplifiers arranged in a cross-coupled type of multivibrator. It is to be noted that each anti-saturation circuit of the invention in either case always operates independently in each amplifier controlled. In addition, a variation in the output voltage of a potential source tends to cause no appreciable increase in current to a conducting transistor as is the case in circuits of the prior art.

Furthermore, the invention makes it possible to maintain the collector-to-base voltage of the transistor at a selected constant magnitude with a high degree of accuracy and thereby to establish a constant level of its high current conduction state with considerable accuracy.

What is claimed is:

1. In a transistor amplifier circuit wherein the collector electrode of the transistor receives operating potential through a load impedance, the base electrode of said transistor receiving an input signal through a coupling impedance, a device for preventing saturation in said transistor, said device comprising: a battery having first and second terminals, the first terminal of said battery being connected to said coupling impedance, and the second terminal of said battery being connected to said base electrode; the potential developed by said battery being selected to establish a bias level which permits high current conduction through said transistor without saturation; and a diode having a first terminal connected to the first terminal of said battery and a second terminal connected to the collector electrode of said transistor, said diode being arranged to be forward biased to pass the signal of said battery to said collector when said transistor reaches said high current conduction condition.

2. In a multivibrator circuit including first and second transistors T1 and T2, each having base, collector and emitter electrodes, said circuit further including two load impedances ZL1 and ZL2 coupled between a source of potential and the collector electrodes of transistors T1 and T2, respectively, said load impedances ZL1 and ZL2 being also coupled to input impedances Z*c*2 and Z*c*1, respectively, a feedback device F*b*1 coupling the base and collector electrodes of transistor T1 and a feedback device F*b*2 coupling the base and collector electrodes of transistor T2, each of said feedback devices comprising: a first diode D*z* having one electrode coupled to the base of the associated transistor, said first diode being selected to have a voltage breakdown condition so as to regulate the voltage appearing between the collector and base electrodes of the associated transistor so as to prevent saturation for a range of current conditions corresponding to the input signal variation applied to said input impedances; a second diode D*n* having one electrode, corresponding to said one electrode of said first diode, coupled to the second electrode of said first diode D*z*, said second diode D*n* having its second electrode coupled to the collector electrode of the associated transistor and being selected to be forward biased by the regulating voltage condition of said first diode D*z* so as to apply such regulating voltage to the collector electrode of the associated transistor.

3. In the multivibrator circuit defined in claim 2 wherein said transistors are NPN transistors, said first diode D*z* having its anode coupled to the base electrode of the associated transistor and its cathode coupled to the anode of said second diode D*n*, the cathode of said second diode D*n* being connected to the collector electrode of said associated transistor.

4. In the multivibrator circuit of claim 2 wherein said transistors are PNP transistors, said first diode D*z* having its cathode coupled to the base of its associated transistor and the anode of said first diode D*z* is coupled to the cathode of said second diode D*n*, the anode of said second diode D*n* being coupled to the collector electrode of its associated transistor.

References Cited in the file of this patent

UNITED STATES PATENTS

| | | |
|---|---|---|
| 2,502,687 | Weiner | Apr. 4, 1950 |
| 2,545,349 | Foster | Mar. 13, 1951 |
| 2,603,750 | Newman | July 15, 1952 |

(Other references on following page)

UNITED STATES PATENTS

| | | |
|---|---|---|
| 2,632,064 | Onia | Mar. 17, 1953 |
| 2,655,608 | Valdes | Oct. 13, 1953 |
| 2,655,609 | Shockley | Oct. 13, 1953 |
| 2,724,780 | Harris | Nov. 22, 1955 |
| 2,803,747 | Woods | Aug. 20, 1957 |
| 2,823,856 | Booth | Feb. 18, 1958 |
| 2,880,330 | Linvill et al. | Mar. 31, 1959 |
| 2,892,103 | Scarbrough | June 23, 1959 |

FOREIGN PATENTS

| | | |
|---|---|---|
| 766,210 | Great Britain | Jan. 16, 1957 |
| 1,122,425 | France | Sept. 6, 1956 |
| 215,148 | Australia | Nov. 21, 1957 |

OTHER REFERENCES

J. G. Linville: "Nonsaturating Pulse Circuits Using Two Junction Transistors," Proceedings of the IRE, pages 826–833, July 1955.